(12) United States Patent
Liu

(10) Patent No.: US 11,798,881 B2
(45) Date of Patent: Oct. 24, 2023

(54) ANTI-FUSE STRUCTURE AND METHOD FOR FABRICATING SAME, AS WELL AS SEMICONDUCTOR DEVICE

(71) Applicant: Changxin Memory Technologies, Inc., Anhui (CN)

(72) Inventor: Chih Cheng Liu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 166 days.

(21) Appl. No.: 17/322,000

(22) Filed: May 17, 2021

(65) Prior Publication Data
US 2021/0272899 A1 Sep. 2, 2021

Related U.S. Application Data

(63) Continuation of application No. 16/882,195, filed on May 22, 2020, now Pat. No. 11,043,450, which is a (Continued)

(30) Foreign Application Priority Data

Dec. 29, 2017 (CN) .......................... 201711488681.0

(51) Int. Cl.
*H01L 23/525* (2006.01)
*H01L 23/528* (2006.01)
*H01L 21/311* (2006.01)

(52) U.S. Cl.
CPC ........ *H01L 23/5252* (2013.01); *H01L 21/311* (2013.01); *H01L 23/5283* (2013.01)

(58) Field of Classification Search
CPC ........... H01L 29/42368; H01L 23/5252; H01L 27/11206; H10B 20/20; H10B 20/25
See application file for complete search history.

(56) References Cited

U.S. PATENT DOCUMENTS

2008/0197911 A1 8/2008 Lim et al.
2014/0183689 A1 7/2014 Sung

FOREIGN PATENT DOCUMENTS

CN 103456710 A 12/2013
CN 105849861 A * 8/2016 ......... H01L 23/5252
(Continued)

OTHER PUBLICATIONS

PCT International Search Report and the Written Opinion dated Apr. 4, 2019, issued in related International Application No. PCT/CN2018/125298 (9 pages).
(Continued)

*Primary Examiner* — Peter M Albrecht
(74) *Attorney, Agent, or Firm* — Sheppard Mullin Richter & Hampton LLP

(57) ABSTRACT

An anti-fuse structure, a method for fabricating the anti-fuse structure, and a semiconductor device are disclosed. The anti-fuse structure includes a semiconductor substrate, a fuse oxide layer, a gate material layer, a first electrode and a second electrode. An active area is defined on the semiconductor substrate by an isolation structure. The active area includes a wide portion and a narrow portion connected to each other. The fuse oxide layer is located on the semiconductor substrate, covers the narrow portion and extends to cover a first part of the wide portion. The gate material layer is formed on the fuse oxide layer. The first electrode is formed on and electrically connected to the gate material layer, while the second electrode is formed on and electrically connected to a second part of the wide portion not covered by the fuse oxide layer.

19 Claims, 6 Drawing Sheets

Related U.S. Application Data continuation of application No. PCT/CN2018/125298, filed on Dec. 29, 2018.

(56) References Cited

FOREIGN PATENT DOCUMENTS

| | | |
|---|---|---|
| CN | 105849861 A | 8/2016 |
| CN | 108039345 A | 5/2018 |

OTHER PUBLICATIONS

PCT International Preliminary Report on Patentability dated Jul. 9, 2020, issued in related International Application No. PCT/CN2018/125298 (7 pages).

First Search dated Jul. 5, 2018, issued in related Chinese Application No. 201711488681.0 (2 pages).

First Office Action dated Jul. 16, 2018, issued in related Chinese Application No. 201711488681.0, with English machine translation (19 pages).

* cited by examiner

ANTI-FUSE STRUCTURE AND METHOD FOR FABRICATING SAME, AS WELL AS SEMICONDUCTOR DEVICE

CROSS-REFERENCE TO RELATED APPLICATIONS

This application is a continuation application of U.S. patent application Ser. No. 16/882,195, filed on May 22, 2020, which is a continuation application of International Patent Application No.: PCT/CN2018/125298, filed on Dec. 29, 2018, which claims priority to China Patent Application No. 201711488681.0, filed with the China Patent Office on Dec. 29, 2017 and entitled "ANTI-FUSE STRUCTURE AND METHOD FOR FABRICATING SAME, AS WELL AS SEMICONDUCTOR DEVICE." The above-referenced applications are incorporated herein by reference in their entirety.

TECHNICAL FIELD

The present disclosure relates to the field of semiconductor technology and, in particular, to an anti-fuse structure, a method for fabricating the anti-fuse structure and a semiconductor device.

BACKGROUND

Fuses and anti-fuses are widely used in existing integrated circuits (ICs) to selectively connect a component to other parts of the circuit or disconnect the component from the other parts of the circuit so as to provide logic operations. A fuse can be activated (i.e., melted, blown, etc.) to break or cut off an electrical connection, thus increasing circuit resistance and providing a logic difference between an activated fuse structure and an un-activated fuse structure. An anti-fuse functions just the opposite way, as anti-fuse is non-conductive when not activated and becomes conductive after being activated (e.g., through breakdown, metal diffusion, transformation from amorphous to polycrystalline silicon, etc.), and an activated anti-fuse establishes an electrical connection to selectively connect two devices or chips that were originally electrically isolated from each other or provide a different resistance for logic operation.

An anti-fuse element is typically a sandwich structure comprising upper and lower electrodes and an anti-fuse dielectric layer between these electrodes. Established anti-fuse structures insofar mainly include ONO (Oxide-Nitride-Oxide) anti-fuse, amorphous-silicon anti-fuse and fuse oxide anti-fuses. Since the formation of the ONO anti-fuse and amorphous-silicon anti-fuses is incompatible with existing CMOS processes, fuse oxide anti-fuses are currently the most popular anti-fuse structures. A fuse oxide anti-fuse is a sandwich structure consisting of a substrate, a fuse oxide layer and a gate electrode. Because existing fuse oxide layers are still relatively thick, a high voltage from a high-voltage transistor is required to program the fuse oxide anti-fuses. As the feature size of semiconductor technology continues to shrink, the formation of such high-voltage transistors will become increasingly challenging.

SUMMARY OF THE DISCLOSURE

The present disclosure provides an anti-fuse structure that can be broken down at a lower voltage and a method for fabricating such a structure.

According to one aspect, the anti-fuse structure provided in the present disclosure comprises:

a semiconductor substrate, wherein an active area is defined on the semiconductor substrate by an isolation structure, the active area comprising a wide portion and a narrow portion connected to each other;

a fuse oxide layer formed on the semiconductor substrate, the fuse oxide layer covering the narrow portion and extending from the narrow portion to cover a part of the isolation structure, the fuse oxide layer also extending to cover a first part of the wide portion at a side of the wide portion adjacent to the narrow portion, wherein the first part of the wide portion comprises two corners of the wide portion adjacent to the narrow portion and an edge of the wide portion connecting the narrow portion, and the fuse oxide layer has a smaller thickness at the portion covering the corners and the edge of the wide portion than at the portion covering the isolation structure;

a gate material layer formed on the fuse oxide layer;

a first electrode formed on and electrically connected to the gate material layer; and a second electrode formed on and electrically connected to a second part of the wide portion that is not covered by the fuse oxide layer.

In some embodiments, in the anti-fuse structure, each of the narrow portion and the wide portion may be of a rectangular shape so that the active area comprises a "T" shaped surface.

In some embodiments, in the anti-fuse structure, a line connecting centers of the narrow portion and the wide portion may be parallel to a side of the wide portion.

In some embodiments, in the anti-fuse structure, the corners and edge may comprise an "L" shape.

In some embodiments, in the anti-fuse structure, the narrow portion may have a width that is 1/5-1/20 of a width of the wide portion in a same direction.

In some embodiments, in the anti-fuse structure, the active area may comprise an anti-fuse implant region and a doped region, the anti-fuse implant region formed at least in the narrow portion and in the first part of the wide portion covered by the fuse oxide layer, the doped region formed in the second part of the wide portion not covered by the fuse oxide layer, the doped region having a depth that is smaller than a depth of the anti-fuse implant region so that the doped region is located on the anti-fuse implant region in the second part of the wide portion, the anti-fuse implant region and the doped region doped with different dopants.

In some embodiments, in the anti-fuse structure, the anti-fuse implant region may be doped at a concentration ranging from $1e^{14}/cm^2$ to $1e^{15}/cm^2$.

According to another aspect, the present disclosure also provides a method for fabricating an anti-fuse structure, comprising:

providing a semiconductor substrate;

forming an isolation structure in the semiconductor substrate to define an active area comprising a wide portion and a narrow portion connected to the wide portion;

forming a fuse oxide layer on the semiconductor substrate, the fuse oxide layer covering the narrow portion and extending from the narrow portion to cover a part of the isolation structure, the fuse oxide layer also extending to cover a first part of the wide portion at a side of the wide portion adjacent to the narrow portion, wherein the first part of the wide portion comprises two corners of the wide portion adjacent to the narrow portion and an edge of the wide portion connecting the narrow portion, and the fuse oxide layer has a smaller thickness at the portion covering the corners and the edge of the wide portion than at the portion covering the isolation structure;

forming a gate material layer on the fuse oxide layer; and forming a first electrode on the gate material layer and a second electrode on a second part of the wide portion that is not covered by the fuse oxide layer, the first electrode electrically connected to the gate material layer, the second electrode electrically connected to the wide portion.

In some embodiments, in the method, each of the narrow portion and wide portion may be of a rectangular shape so that the active area comprises a "T" shaped surface.

In some embodiments, in the method, a line connecting centers of the narrow portion and the wide portion may be parallel to a side of the wide portion.

In some embodiments, in the method, the corners and edge may comprise an "L" shape.

In some embodiments, the method may further comprise, subsequent to the formation of the first and second electrodes:

connecting the first and second electrodes to a power supply so as to break down the fuse oxide layer at the corners of the wide portion and the edge of the wide portion connecting the narrow portion.

In some embodiments, in the method, the narrow portion may have a width that is 1/5-1/20 of a width of the wide portion in a same direction.

In some embodiments, in the method, the formation of the isolation structure in the semiconductor substrate to define the active area may comprise:

forming a doped region in an upper portion of the semiconductor substrate that is close to a top surface of the semiconductor substrate and forming a trench in the semiconductor substrate by photolithography and etching processes, the trench defining a first mesa and a second mesa connected to each other, the second mesa having a width that is smaller than a width of the first mesa in a same direction, the trench having a depth greater than a depth of the doped region;

forming the isolation structure by filling the trench with an isolation material; and forming the wide portion and the narrow portion by doping the first mesa and a part of the second mesa, wherein the doping results in an anti-fuse implant region which is formed at least in the narrow portion and in the first part of the wide portion covered by the fuse oxide layer and a doped region in the second part of the wide portion not covered by the fuse oxide layer, the doped region having a depth that is smaller than a depth of the anti-fuse implant region so that the doped region is located on the anti-fuse implant region in the second part of the wide portion, the anti-fuse implant region and the doped region doped with different dopants.

In some embodiments, in the method, the anti-fuse implant region is doped at a concentration ranging from $1e^{14}/cm^2$ to $1e^{15}/cm^2$.

The present disclosure also provides a semiconductor device, comprising:

a semiconductor substrate, wherein an active area is defined on the semiconductor substrate by an isolation structure, the active area comprising a wide portion and a narrow portion connected to each other;

a first anti-fuse material layer on the semiconductor substrate, the first anti-fuse material layer covering the narrow portion and extending from the narrow portion to cover a part of the isolation structure, the first anti-fuse layer also extending to cover a first part of the wide portion at a side of the wide portion adjacent to the narrow portion, wherein the first part of the wide portion comprises two corners of the wide portion adjacent to the narrow portion and an edge of the wide portion connecting the narrow portion, and the first anti-fuse layer has a smaller thickness at the portion covering the corners and the edge of the wide portion than at the portion covering the isolation structure;

a second anti-fuse material layer, formed on the first anti-fuse material layer;

a first electrode, formed on and electrically connected to the second anti-fuse material layer; and a second electrode formed on and electrically connected to a second part of the wide portion that is not covered by the first anti-fuse material layer.

In some embodiments, one of the first anti-fuse material layer and the second anti-fuse material layer has an anti-fuse break down feature at a position located in the portion covering the first part of the wide portion so as to provide an electrical connection path between the first and second electrodes.

In some embodiments, each of the narrow portion and the wide portion is of a rectangular shape so that the active area comprises a "T" shaped surface.

In some embodiments, a line connecting centers of the narrow portion and the wide portion is parallel to a side of the wide portion.

In some embodiments, the corners and the edge comprise an "L" shape.

In the anti-fuse structure and the method provided by the present disclosure, the active area has the interconnected wide and narrow portions, and the fuse oxide layer on the semiconductor substrate covers the narrow portion and extends to cover a part of the wide portion. Accordingly, the position where the fuse oxide layer will be fused is limited to the portion covering the edge of the wide portion connecting the narrow portion. Moreover, as this portion of the fuse oxide layer covering the corners of the wide portion and/or the edge of the wide portion connecting the narrow portion is thinner, it can be broken down more easily, thus resulting in a lower power consumption.

Due to the easier breakdown of the fuse oxide layer, requirement for the peripheral circuit design can be lowered, and the peripheral circuit structure can be simplified. When the anti-fuse structure is used in the fabrication of a memory device, a higher memory capacity of the memory device can be obtained.

Figure 1:
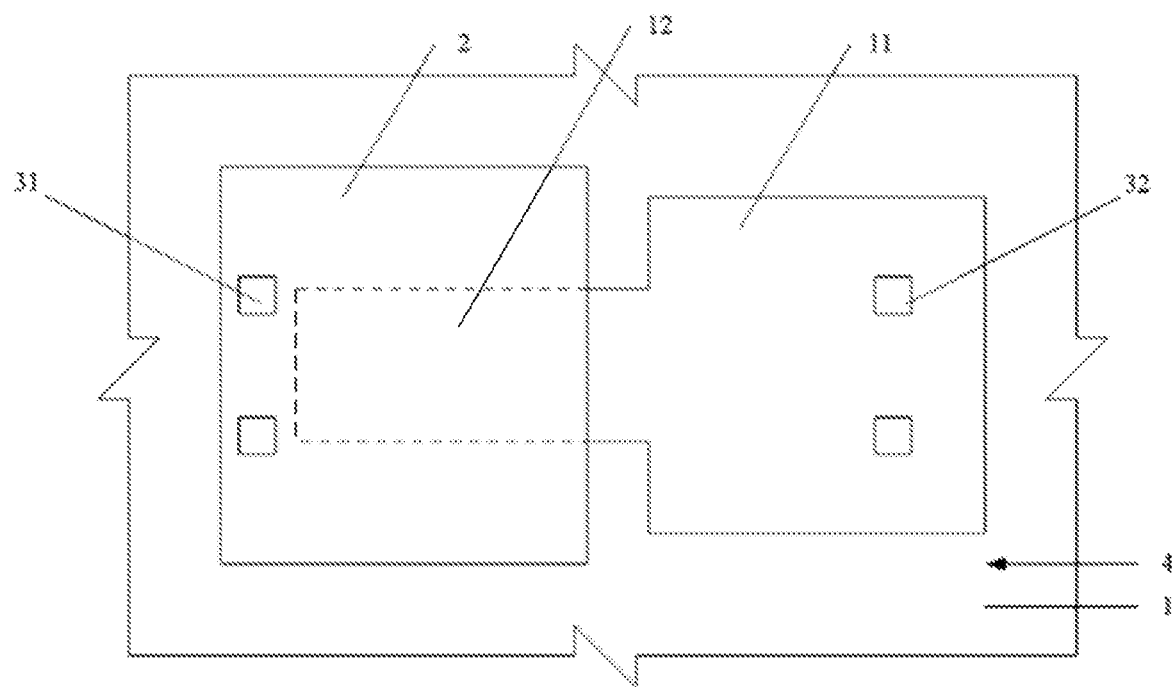
FIG. 1 is a structural schematic of an anti-fuse structure.

A list of reference numerals in the Drawings is provided as follows.

| | |
|---|---|
| 1, 10, 100 | semiconductor substrate |
| 11, 111, 1011 | wide portion |

| | |
|---|---|
| 12, 112, 1012 | narrow portion |
| 113, 1013 | anti-fuse implant region |
| 114, 1014 | doped region |
| 101 | trench |
| 1016 | first anti-fuse material layer |
| 1017 | second anti-fuse material layer |
| 2, 20 | gate structure |
| 210 | fuse oxide layer |
| 220 | gate material layer |
| 31, 310, 1018 | first electrode |
| 32, 320, 1019 | second electrode |
| 4, 40, 1015 | isolation structure |

DETAILED DESCRIPTION

Anti-fuse structures, methods for fabricating them and semiconductor devices according to the present disclosure will be described below in greater detail with reference to the accompanying schematics, which illustrate preferred embodiments of the disclosure. Those skilled in the art can make changes to the disclosure herein while still obtaining the beneficial results thereof. Therefore, the following description shall be construed as being intended to be widely known by those skilled in the art rather than as limiting the disclosure.

Any layer (or film), region, pattern or structure described hereinafter as being "on" or "over" a substrate, another layer (or film), another region, a pad and/or another pattern may be either in direct contact with the other substrate, layer, region, pad and/or pattern, or indirectly on the other substrate, layer, region, pad and/or pattern with one or more layers inserted therebetween. In addition, any layer described hereinafter as being "under" another layer may be either in direct contact with the other layer, or indirectly under the other layer with one or more layers inserted therebetween. Further, reference can be made to the appended figures for the disposition of various layers "on" or "under" one another.

FIG. 1 is a structural schematic of an anti-fuse structure. As shown in FIG. 1, the anti-fuse structure includes a semiconductor substrate 1 in which an isolation structure 4 is formed, for example, by a trenching and filling process. The isolation structure 4 defines an active area comprising a wide portion 11 and a narrow portion 12. A gate structure 2 is located on the semiconductor substrate 1, covering a part of the narrow portion 12, without contact with the wide portion 11. The gate structure 2 may include a fuse oxide layer located on the semiconductor substrate 1 and a polysilicon layer located on the fuse oxide layer. A first electrode 31 is formed on the gate structure 2 and a second electrode 32 on the wide portion 11. The first and second electrodes 31, 32 may be in the form of plugs and connected to individual metal pads each has a larger area than the first or second electrodes 31, 32. When a sufficiently high voltage is applied across the first and second electrodes 31 via the metal pads, the fuse oxide layer can be broken down, achieving an anti-fuse function. However, as the narrow portion 12 is narrower, and thus has a higher resistance, than the wide portion 11, a greater current is required to break down the fuse oxide layer on the gate structure 2 covering only the narrow portion 12.

Figure 2:
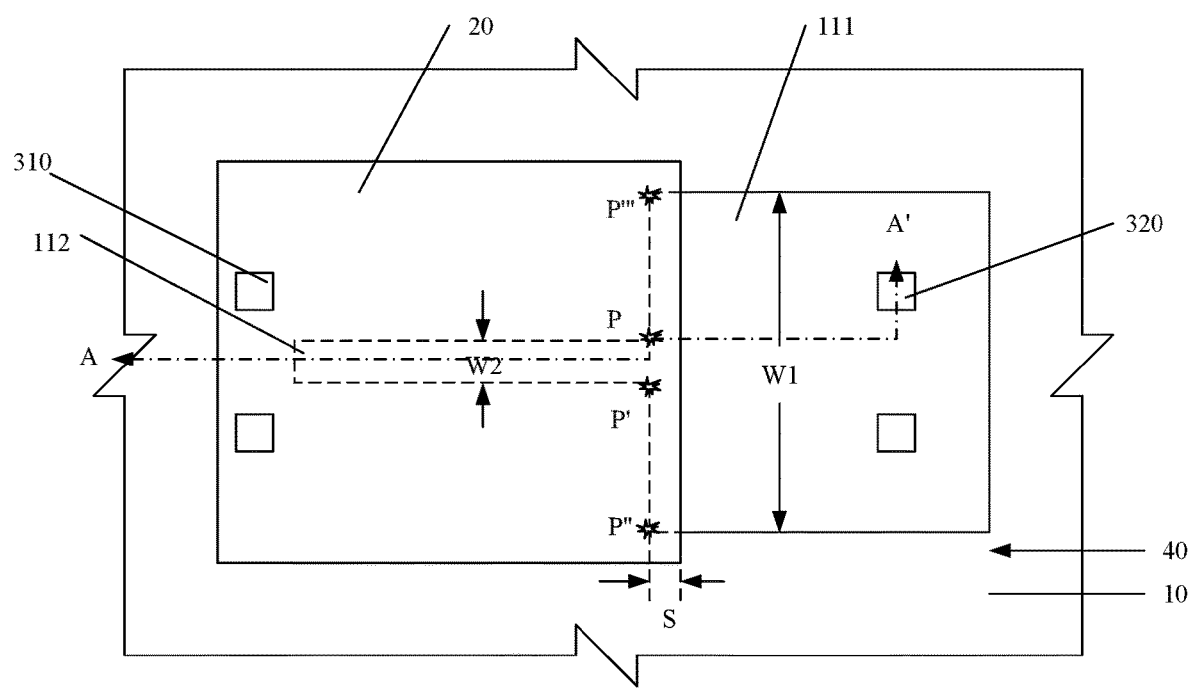
FIG. 2 is a structural schematic of an anti-fuse structure according to an embodiment of the present disclosure.
Figure 3:
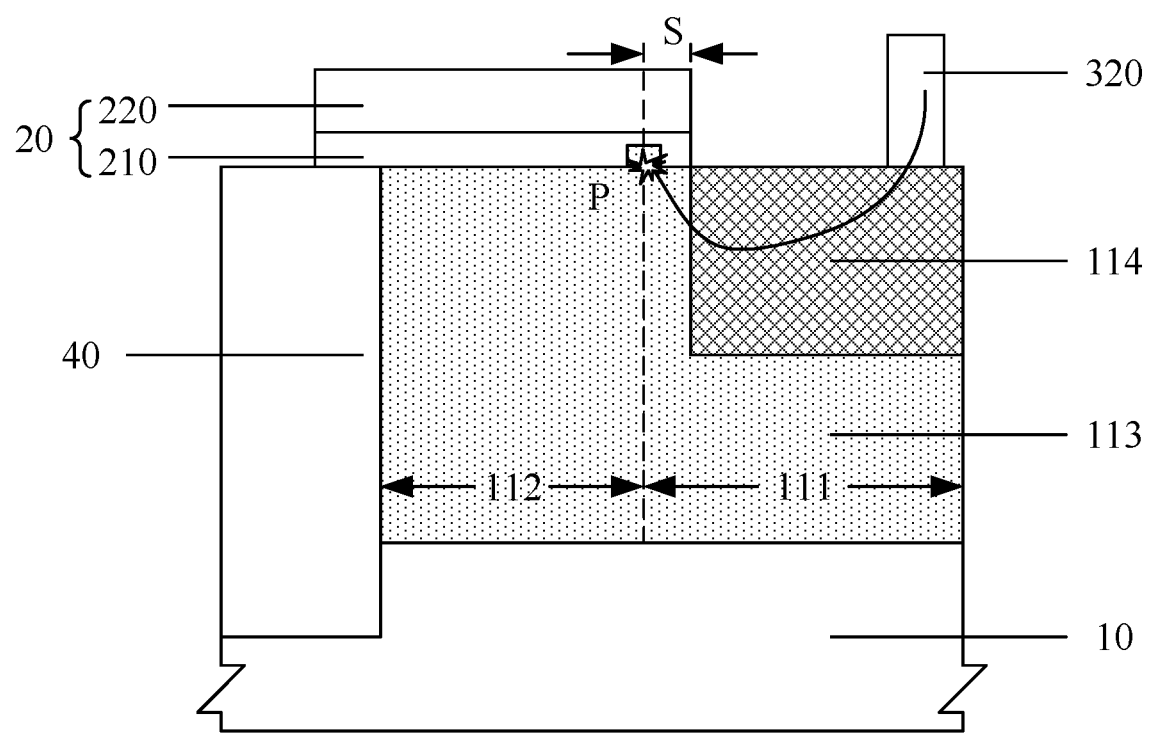
FIG. 3 is a schematic cross-sectional view taken along a line AA' of FIG. 2.

The present disclosure provides a more easily implementable anti-fuse structure and a method for fabricating it. Referring to FIG. 2, a structural schematic of an anti-fuse structure is provided according to an embodiment of the present disclosure. Also referring to FIG. 3, a schematic cross-sectional view taken along the line A-A' in FIG. 2 is provided according to some embodiments of the present disclosure. As shown in FIGS. 2 and 3, the anti-fuse structure of the present disclosure includes:

a semiconductor substrate 10, wherein an active area is defined on the semiconductor substrate 10 by an isolation structure 40, the active area comprising a wide portion 111 and a narrow portion 112 connected to the wide portion 111;

a fuse oxide layer 210 on the semiconductor substrate 100, the fuse oxide layer 210 covering the narrow portion 112 and extending to cover a first part of the wide portion 111;

a gate material layer 220 formed on the fuse oxide layer 210;

a first electrode 310, formed on and electrically connected to the gate material layer 220; and a second electrode 320, formed on and electrically connected to a second portion of the wide portion 111 not covered by the fuse oxide layer 210.

In some embodiments, the fusion may be limited to only one side of the wide portion 111 that is adjacent to the narrow portion 112, e.g., the edge of the wide portion 111 connected to the narrow portion 112. Additionally, the fuse oxide layer is thinner at the portion covering the corners and/or edge of the wide portion 111 connecting the narrow portion 112, it can be broken down more easily, thus resulting in a lower power consumption. In one embodiment, the semiconductor substrate 10 may be an undoped monocrystalline silicon substrate, a doped monocrystalline silicon substrate, a silicon-on-insulator (SOI) substrate or the like. In an exemplary embodiment, the semiconductor substrate 10 is a monocrystalline silicon substrate. Without limitation to the present disclosure, well-known features such as buried layers (not shown) may also be formed in the semiconductor substrate 10.

The isolation structure 40 may be formed of an available material, for example, including silicon oxide and/or silicon nitride. In one embodiment, silicon oxide is included. In some embodiments, the isolation structure 40 may be formed by growing the material in a formed trench.

The isolation structure 40 defines the active area in the semiconductor substrate 10. For example, the active area has the connected wide and narrow portions 111, 112.

In one embodiment, each of the narrow and wide portions 112, 111 is of a rectangular shape so that the active area comprises a "T" shaped surface.

In one embodiment, a line connecting centers of the narrow and wide portions 112, 111 is parallel to a side of the wide portion 111. That is, the narrow portion 112 is connected to the middle of the side of the wide portion 111 connected to the narrow portion 112.

In one embodiment, a width "W2" of the narrow portion 112 is 1/5-1/20 of a width "W1" of the wide portion 111, for example, the ratio between "W2" and "W1" may be 1/6, 1/7, 1/8, 1/9, 1/10, 1/11, 1/12, 1/13, 1/14, 1/15, 1/16, 1/17, 1/18, 1/19, etc. By setting such a width relationship, the resistances of the narrow and wide portions 112, 111 may be adjusted, so that a current flowing through different portions (i.e., the narrow and wide portions 112, 111) of the active area may have different magnitudes. For example, a programming current may flow through the wide portion 111 and a breakdown current may flow through the narrow portion 112.

The fuse oxide layer 210 formed on the semiconductor substrate 10 covers the narrow portion 112 and extends to cover a first part of the wide portion 111. In some embodiments, the fuse oxide layer 210 also covers a part of the isolation structure 40, that is, the fuse oxide layer 210 extends from the narrow portion 112 to cover a part of the isolation structure 40 and a side of the wide portion 111 adjacent to the narrow portion 112. Therefore, the fuse oxide layer 210 extends to cover the two corners of the wide portion 111 adjacent to the narrow portion 112 as well as the edge of the wide portion 111 connecting the narrow portion 112. As a result, the fuse oxide layer 210 is thinner and lower in quality at the portion covering the corners and edge than at the portions covering the isolation structure 40. In this way, the breakdown point "P" is limited to the portion of the fuse oxide layer 210 covering the corners of the wide portion 111 and/or the edge of the wide portion 111 connecting the narrow portion 112.

In one embodiment, the portion over the corners and edge comprises an "L" shape.

In one embodiment, the portion of the fuse oxide layer 210 overlapping the wide portion 111 has a width "S" that may be as small as permitted by the used process. In some embodiments, the width "S" may vary with different processes practically used.

The gate material layer 220 is located on the fuse oxide layer 210. In one embodiment, the gate material layer 220 and the fuse oxide layer 210 together constitute a gate structure 20.

In one embodiment, the gate material layer 220 may be formed of polysilicon or a metallic material, such as tungsten, titanium nitride, tantalum nitride, a titanium aluminum alloy or the like.

As shown in FIG. 3, the wide portion 111 of the active area includes an anti-fuse implant region 113 and a doped region 114. The anti-fuse implant region 113 is formed at least in the narrow portion 112 and in the first part of the wide portion 111 covered by the fuse oxide layer 210, while the doped region 114 is formed in the second part of the wide portion 111 not covered by the fuse oxide layer 210. The doped region 114 has a depth that is smaller than a depth of the anti-fuse implant region 113 so that the doped region 114 is located on a part of the anti-fuse implant region 113 which is formed on the second part of the wide portion 111 not covered by the fuse oxide layer 210. The anti-fuse implant region 113 and the doped region 114 are doped with different dopants.

For example, the anti-fuse implant region 113 may be a P-doped region, with the doped region 114 being an N-doped region.

In one embodiment, the anti-fuse implant region 113 is doped at a concentration ranging from $1e^{14}/cm^2$ to $1e^{15}/cm^2$.

The first and second electrodes 310, 320 may be formed of a metallic material or polysilicon. For example, the first and second electrodes 310, 320 may be aluminum electrodes.

In addition, an overlying metal layer may be formed on the first electrode 310 (e.g., the first electrode 310 may be connected to a metal pad with a larger area, which is not shown in the figures), and another overlying metal layer may be formed on the second electrode 320 (e.g., the second electrode 320 may also be connected to a metal pad with a larger area, which is not shown in the figures either). The two metal layers may either be fabricated from a single layer or not from the same layer, depending on the practical needs.

In some embodiments, the two metal layers may be separated from the underlying structures (e.g., the gate structure, the active area, etc.) by a dielectric layer (not shown) so that the first and second electrodes 310, 320 are located within the dielectric layer.

Figure 4:
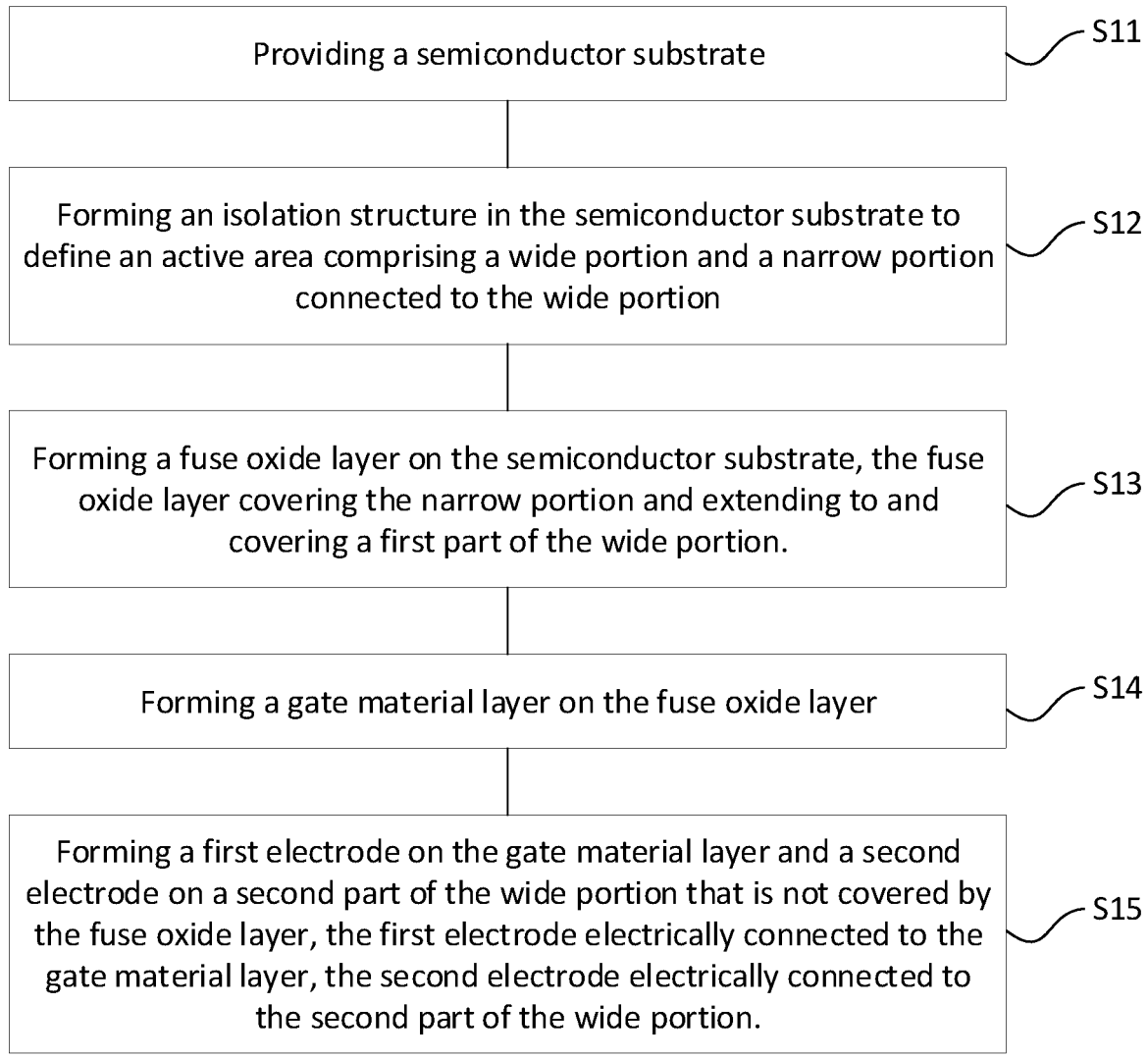
FIG. 4 is a flowchart of a method for fabricating an anti-fuse structure according to an embodiment of the present disclosure.

Still referring to FIGS. 2 and 3, and additionally to FIGS. 4 and 5, a method for fabricating an anti-fuse structure according to the present disclosure will be described below.

The method includes the steps of:

S11: providing a semiconductor substrate;

S12: forming an isolation structure in the semiconductor substrate to define an active area comprising a wide portion and a narrow portion connected to the wide portion;

S13: forming a fuse oxide layer on the semiconductor substrate, the fuse oxide layer covering the narrow portion and extending to cover a first part of the wide portion;

S14: forming a gate material layer on the fuse oxide layer; and

S15: forming a first electrode on the gate material layer and a second electrode on a second part of the wide portion that is not covered by the fuse oxide layer, the first electrode electrically connected to the gate material layer, the second electrode electrically connected to the second part of wide portion.

In step S11, a semiconductor substrate 10 is provided. In one embodiment, the semiconductor substrate 10 has a first surface and a second surface opposing each other. A doped region 114 is formed in a region of the semiconductor substrate 10 that is close to the first surface (i.e., the top surface). The semiconductor substrate 10 may be an undoped monocrystalline silicon substrate, a doped monocrystalline silicon substrate, a silicon-on-insulator (SOI) substrate or the like. In an exemplary embodiment, the semiconductor substrate 10 is a monocrystalline silicon substrate. Without limitation to the present disclosure, well-known features such as buried layers (not shown) may also be formed in the semiconductor substrate 10.

The doped region 114 may be formed, for example, by implanting ions into the semiconductor substrate 10. For example, the doped region may be formed by epitaxial growth on the semiconductor substrate 10 followed by ion implantation. In one embodiment, in case of PMOS, the doped region 114 may be an N-well formed by ion implantation.

Figure 5:
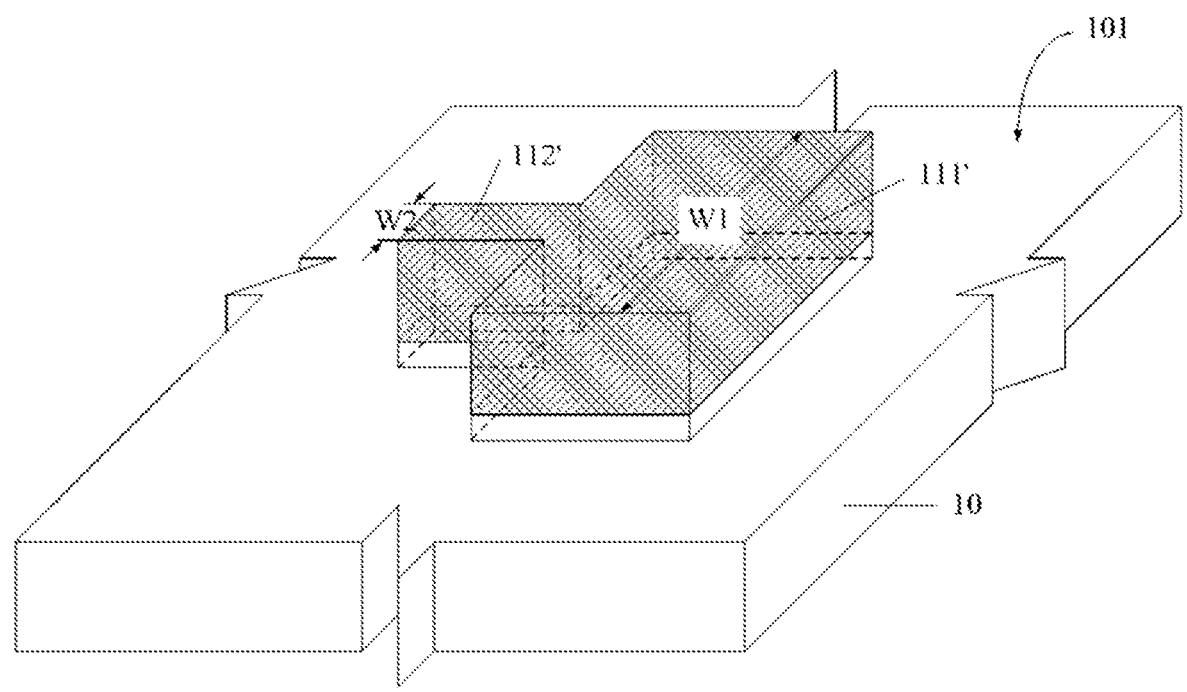
FIG. 5 is a schematic illustrating the formation of a trench in a semiconductor substrate according to an embodiment of the present disclosure.

In step S12, with combined reference to FIGS. 2, 3 and 5, an isolation structure 40 is formed in the semiconductor substrate 10 to define an active area comprising a wide portion 111 and a narrow portion 112 connected to the wide portion 111.

In one embodiment, a trench 101 may be formed in the doped region 114. The trench 101 has an opening at the first surface (i.e., the top surface) of the substrate 10. In some embodiments, this process may be completed by a photolithography and etching process. One or multiple trenches 101 may be formed, depending on the structure to be fabricated. For example, in case of only one DRAM cell to be fabricated, only one trench 101 may be formed, and in case of a DRAM array to be fabricated, multiple trenches 101 may be formed.

The trench 101 defines a first mesa 111' and a second mesa 112' connected to the first mesa 111'. The second mesa 112' has a width "W2" that is smaller than a width "W1" of the first mesa 111' in parallel with the width "W2." The trench 101 has a depth greater than a depth of the doped region 114. At this point, both the first and second mesas 111', 112' may be portions of the doped region 114. Since the trench 101 will be used to form an isolation structure (such as the isolation structure 40), the depth of the trench 101 being greater than the depth of the doped region 114 is helpful in providing a better isolation so as to avoid unnecessary connections.

In one embodiment, each of the first and second mesas 111', 112' is of a rectangular shape so that the active area comprises a "T" shaped surface.

In one embodiment, a line connecting centers of the first and second mesas 111', 112' is parallel to a side of the first mesa 111'. That is, the second mesa 112' is connected to the middle of the side of the first mesa 111' connected to the second mesa 112'.

In one embodiment, the width "W2" of the second mesa 112' is 1/5-1/20 of the width "W1" of the first mesa 111', for example, the ratio between "W2" and "W1" may be 1/6, 1/7, 1/8, 1/9, 1/10, 1/11, 1/12, 1/13, 1/14, 1/15, 1/16, 1/17, 1/18, 1/19, etc. Setting such a width relationship is helpful in adjusting the resistances of the subsequent-formed narrow and wide portions 112, 111, so that current with different magnitudes may flow through different portions (i.e., the narrow and wide portions 112, 111) of the active area. For example, a programming current may pass the wide portion 111, while a breakdown current may pass the narrow portion 112.

Next, the trench 101 is filled with an isolation material, so as to form the isolation structure 40.

In one embodiment, the isolation material includes at least one of silicon oxide and silicon nitride. For example, the isolation material may be silicon oxide.

The isolation structure 40 has a top surface flush with the top surface of the semiconductor substrate 10. This can be accomplished by a planarization process performed after the isolation material is filled.

Afterward, the first mesa 111' and part of the second mesa 112' are doped, forming the wide portion 111 and the narrow portion 112, respectively. The doping results in the formation of an anti-fuse implant region 113 which is formed at least in the narrow portion 112 and in the first part of the wide portion 111 covered by the fuse oxide layer 210, and a doped region in the second part of the wide portion 111 not covered by the fuse oxide layer 210. In addition, the doped region 114 has a depth that is smaller than a depth of the anti-fuse implant region 113 so that the doped region 114 is located on a part of the anti-fuse implant region 113 formed on the second part of the wide portion 111 not covered by the fuse oxide layer 210. The anti-fuse implant region 113 and the doped region 114 are doped with different dopants.

For example, if the doped region 114 is an N-doped region, the anti-fuse implant region 113 may be doped with P-type ions such as trivalent boron ions. If the doped region 114 is a P-doped region, the anti-fuse implant region 113 may be doped with N-type ions such as pentavalent phosphorus ions.

The implantation may be carried out at a controlled energy level ensuring the ions are delivered to the desired portion of the doped region 114 to form the anti-fuse implant region 113.

In one embodiment, the ion implantation is performed at a concentration ranging from $1e^{14}/cm^2$ to $1e^{15}/cm^2$.

During the implantation, a mask may be used to prevent the dopant ions from interfering with the isolation structure 40 and other layers.

In one embodiment, the mask may be provided by a masking block in the ion implantation apparatus, which is brought into tight contact with the semiconductor substrate 10 during the implantation.

In one embodiment, the mask may be photoresist that is applied on the surface of the semiconductor substrate 10 and processed by a photolithography process to expose the first and second mesas 111', leaving the other portions masked.

Subsequent to the completion of the ion implantation process, the mask may be removed. In case of photoresist being used as the mask, it may be removed by ashing or wet etching.

In step S13, a fuse oxide layer 210 is formed on the semiconductor substrate 10 so that it covers the narrow portion 112 and extends to cover a first part of the wide portion 111.

In one embodiment, the fuse oxide layer 210 may be formed of, for example, silicon oxide, by chemical vapor deposition In one embodiment, the fuse oxide layer 210 has a thickness of smaller than 40 Å. Such a thickness is compliant with the miniaturization requirement of the device and helpful in reducing the breakdown voltage.

In some embodiments, the fuse oxide layer 210 also covers a part of the isolation structure 40, that is, the fuse oxide layer 210 extends from the narrow portion 112 to cover a part of the isolation structure 40 and a side of the wide portion 111 adjacent to the narrow portion 112. Therefore, the fuse oxide layer 210 covers the two corners of the wide portion 111 adjacent to the narrow portion 112 as well as the edge of the wide portion 111 connecting the narrow portion 112. As a result, the fuse oxide layer 210 is thinner and lower in quality at the portion covering the corners and the edge of the wide portion 111 than the fuse oxide layer 210 at the portions covering the isolation structure 40. In this way, the breakdown point "P" is limited to the portion of the fuse oxide layer 210 covering the corners of the wide portion 111 and/or the edge of the wide portion 111 connecting the narrow portion 112.

In one embodiment, the portion over the corners and edge comprises an "L" shaped segment.

In one embodiment, the portion of the fuse oxide layer 210 covering the wide portion 111 has a width "S" that may be as small as permitted by the used process. In some embodiments, the width "S" may vary with different processes practically used.

In step S14, a gate material layer 220 is formed on the fuse oxide layer 210. The gate material layer 220 may be formed of, for example, polysilicon or a metallic material, such as tungsten, titanium nitride, tantalum nitride, a titanium aluminum alloy or the like. The formation of the gate material layer 220 may be accomplished using a conventional process, for example, catalytic chemical vapor deposition (Cat-CVD) for polysilicon.

In one embodiment, the gate material layer 220 and the fuse oxide layer 210 together constitute a gate structure 20.

In step S15, a first electrode 310 is formed on the gate material layer 220, and a second electrode 320 on the second part of the wide portion 111 that is not covered by the fuse oxide layer 210. The first electrode 310 is electrically connected to the gate material layer 220, and the second electrode 320 is electrically connected to the wide portion 111.

The first and second electrodes 310, 320 may be formed of a metallic material or polysilicon. For example, the first and second electrodes 310, 320 may be aluminum electrodes.

The first and second electrodes 310, 320 may be formed in a single process as detailed below.

An electrode material layer may be formed first.

In some embodiments, an amorphous silicon film may be formed by providing a silane-based gas and thermally decomposing the gas at a raised temperature. The resulting amorphous silicon film may globally cover the doped region 114 and the gate material layer 220.

The amorphous silicon film may be formed at 20 to 200 Torr from a silane-based gas or an amino silane-based gas supplied at 10-500 sccm.

The amorphous silicon film may then be transformed into a polysilicon film by heat treatment.

The heat treatment may be carried out at 800° C.-950° C. for 10-200 seconds, for example at 900° C. for 30 seconds. In addition, the heat treatment may be carried out in a chamber maintained at a pressure of 1-10 Torr.

During the heat treatment, silicon migration may occur in the amorphous silicon film and lead to silicon agglomeration at the surface of the amorphous silicon film. This may roughen the film surface and reduce its thickness. To avoid this, a pretreatment process may be performed after the formation of the amorphous silicon film and before the heat treatment. The pretreatment process prior to the heat treatment may involve exposure to a pretreatment gas containing any one or more of the elements nitrogen (N), carbon (C), oxygen (O) and boron (B). For example, the pretreatment gas may be any one or more of nitrous oxide ($N_2O$), ethylene ($C_2H_4$), ammonia ($NH_3$) and diborane ($B_2H_6$) and blown onto the amorphous silicon film.

During the pretreatment process, the pretreatment gas will be thermally decomposed, and the element(s) (e.g., at least one of N, C, O and B) will be bonded to silicon. The thermal treatment performed after the bonding can prevent silicon migration caused by bonding between silicon atoms themselves. As a result, a more even surface with reduced roughness can be obtained, which allows a lower contact resistance for the subsequently formed electrodes.

Subsequent to the formation of the polysilicon film, for example, a photolithography process may be performed to expose polysilicon portions to be removed, with the remaining polysilicon portions being covered by photoresist and serving as the electrodes (the first and second electrodes 310, 320) after the removal of the exposed polysilicon portions.

With the photoresist serving as a mask, the undesired polysilicon portions may be removed either by a wet etching process or a dry etching process. For example, a bromine-based gas may be used as the etchant.

While the electrodes have been described above as being formed by etching, they may also be formed using another method, such as trench filling.

In addition, in the case where the electrodes are made of a metallic material, their formation may be similarly accomplished by deposition and etching steps, or by filling trenches formed in a dielectric layer.

If the electrodes are formed by etching, a dielectric layer may be deposited on the semiconductor substrate 10 to surround the formed electrodes (however, the electrodes are exposed at the top to allow their subsequent connections with other layers).

Subsequent to the formation of the first and second electrodes 310, 320, the method may further include forming a first metal layer (e.g., as a metal pad with a larger area, which is not shown) on the first electrode 310 and a second metal layer (e.g., also as a metal pad with a larger area, which is not shown either) on the second electrode 320. The first and second metal layers may either be fabricated from a single layer or not the same layer, depending on the practical needs.

Subsequent to the formation of the first and second electrodes 310, 320, the method may further include connecting the first and second electrodes 310, 320 to a power supply so as to break down the fuse oxide layer 210 at the portion covering the corners of the wide portion 111 and/or the edge of the wide portion 111 connecting the narrow portion 112.

As shown above, in this way, the breakdown will be made more easily and at the fixed positions.

Figure 6:
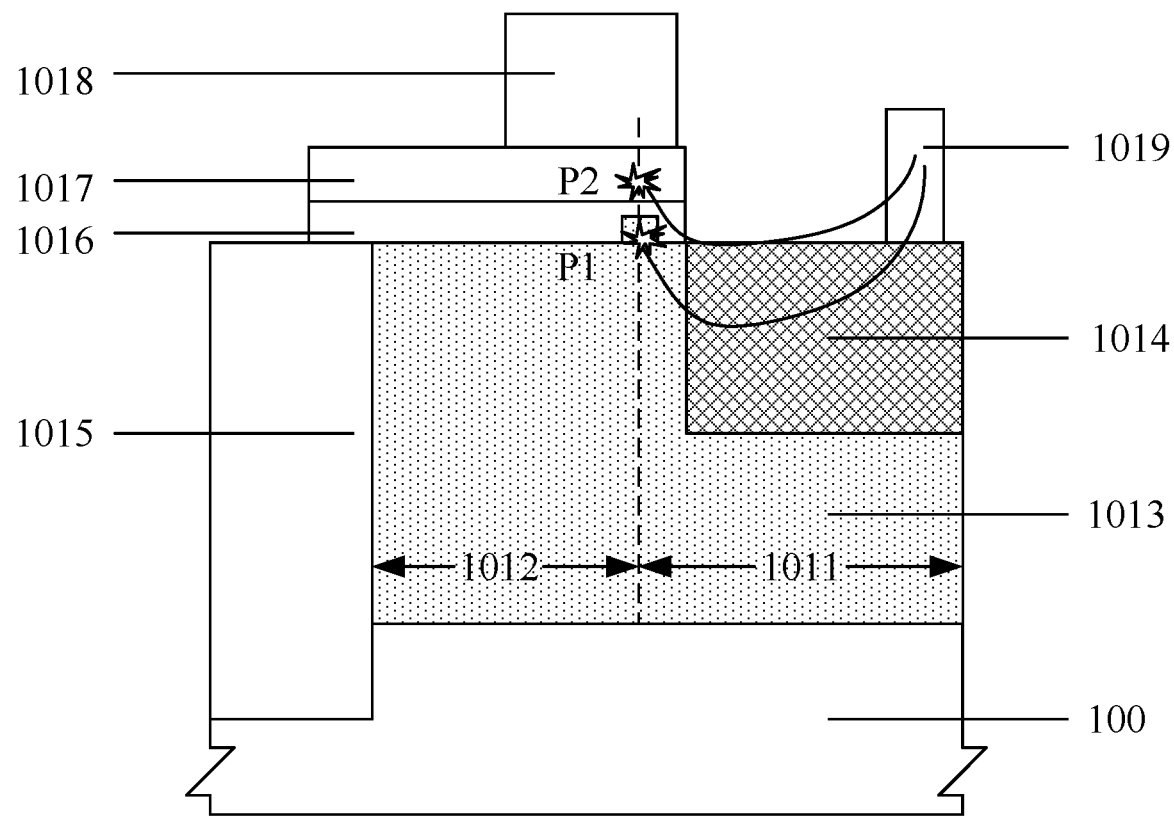
FIG. 6 is a schematic of a semiconductor structure according to an embodiment of the present disclosure.

The present disclosure also provides a semiconductor device, as shown in FIG. 6, including:

a semiconductor substrate 100, wherein an active area is defined on the semiconductor substrate 10 by an isolation structure 40, the active area comprising a wide portion 1011 and a narrow portion 1012 connected to the wide portion 1011;

a first anti-fuse material layer 1016 formed on the semiconductor substrate 100, the first anti-fuse material layer 1016 covering the narrow portion 1012 and extending to cover a first part of the wide portion 1011;

a second anti-fuse material layer 1017 formed on the first anti-fuse material layer 1016;

a first electrode 1018 formed on and electrically connected to the second anti-fuse material layer 1017; and a second electrode 1019 formed on and electrically connected to a second part of the wide portion 1011 that is not covered by the first anti-fuse material layer 1016, wherein one of the first anti-fuse material layer 1016 and the second anti-fuse material layer 1017 has an anti-fuse break down feature, and a breakdown position located in the portion covering the first part of the wide portion so as to provide an electrical connection path between the first and second electrodes 1018, 1019. That is, the electrical connection path between the first and second electrodes 1018, 1019 may be formed through the breakdown position of one of the first anti-fuse material layer 1016 and the second anti-fuse material layer 1017.

For example, FIG. 6 schematically shows two breakdown positions "P1" and "P2," representing the breakdown positions for the first anti-fuse material layer 1016 and the second anti-fuse material layer 1017 respectively. For example, when the second anti-fuse material layer 1017 is broken down at "P2", the first electrode 1018 will be electrically connected to the second electrode 1019. At this point, the first anti-fuse material layer 1016 may be in a conduction state.

In some embodiments, the wide portion 1011 of the active area may include an anti-fuse implant region 1013 and a doped region 1014. The anti-fuse implant region 1013 is formed at least in the narrow portion 1012 and in the first part of the wide portion 1011 covered by the fuse oxide layer, while the doped region is formed in the second part of the wide portion 1011 not covered by the fuse oxide layer 1016. The doped region 1014 may have a depth that is smaller than a depth of the anti-fuse implant region 1013 so that the doped region 1014 is located on a part of the anti-fuse implant region 1013 formed in the second part of the wide portion 1011 not covered by the fuse oxide layer 1016. The anti-fuse implant region 1013 and the doped region 1014 may be doped with different dopants.

In summary, in the anti-fuse structure and the method of the present disclosure, the active area has the interconnected wide and narrow portions, and the fuse oxide layer on the semiconductor substrate covers the narrow portion and extends to cover a first part of the wide portion. Accordingly, the position where the fuse oxide layer will be fused is limited to the portion covering the edge of the wide portion connecting the narrow portion. Moreover, as this portion of the fuse oxide layer covering the corners of the wide portion and/or the edge of the wide portion connecting the narrow portion is thinner, it can be broken down more easily, thus resulting in a lower power consumption.

Due to the easier breakdown of the fuse oxide layer, the requirement for the peripheral circuit design can be lowered, and the peripheral circuit structures can be simplified. When the anti-fuse structure is used in the fabrication of a memory device, a higher memory capacity of the memory device can be obtained.

The description presented above is merely that of some preferred embodiments of the present disclosure and does not limit the scope thereof in any sense. Any and all changes and modifications made by those of ordinary skill in the art based on the above teachings fall within the scope as defined in the appended claims.

What is claimed is:

1. An anti-fuse structure, comprising:
a semiconductor substrate, comprising an active area and an isolation structure, the isolation structure defining the active area, the active area comprising a wide portion and a narrow portion connected to the wide portion;
a fuse oxide layer formed on the semiconductor substrate, the fuse oxide layer covering the narrow portion and extending from the narrow portion to cover a part of the isolation structure, the fuse oxide layer further extending to cover a first part of the wide portion at a side of the wide portion adjacent to the narrow portion, wherein the first part of the wide portion comprises two corners of the wide portion adjacent to the narrow portion and an edge of the wide portion connecting the narrow portion, wherein the fuse oxide layer has a smaller thickness at a first portion of the fuse oxide layer covering the corners and the edge of the wide portion than at a second portion of the fuse oxide layer covering the isolation structure,
wherein an upper surface of the first portion of the fuse oxide layer is level with an upper surface of the second portion of the fuse oxide layer, and the wide portion is connected to only one narrow portion, the narrow portion is connected to the middle of a side of the wide portion connected to the narrow portion;
a gate material layer formed on the fuse oxide layer;
a first electrode formed on and electrically connected to the gate material layer; and
a second electrode formed on and electrically connected to a second part of the wide portion that is not covered by the fuse oxide layer.

2. The anti-fuse structure of claim 1, wherein each of the narrow portion and the wide portion is of a rectangular shape, and the active area comprises a "T" shaped surface.

3. The anti-fuse structure of claim 1, wherein a line connecting centers of the narrow portion and the wide portion is parallel to a side of the wide portion.

4. The anti-fuse structure of claim 1, wherein the corners and the edge of the wide portion comprise an "L" shape.

5. The anti-fuse structure of claim 1, wherein the narrow portion has a width that is 1/5-1/20 of a width of the wide portion in a same direction.

6. The anti-fuse structure of claim 1, wherein the active area comprises an anti-fuse implant region and a doped region, the anti-fuse implant region formed at least in the narrow portion and in the first part of the wide portion covered by the fuse oxide layer, the doped region formed in the second part of the wide portion not covered by the fuse oxide layer, the doped region having a depth that is smaller than a depth of the anti-fuse implant region so that the doped region is located on the anti-fuse implant region in the second part of the wide portion, the anti-fuse implant region and the doped region doped with different dopants.

7. The anti-fuse structure of claim 6, wherein the anti-fuse implant region is doped at a concentration ranging from $1e^{14}/cm^2$ to $1e^{15}/cm^2$.

8. The anti-fuse structure of claim 6, wherein the doped region is an N-doped region, and the anti-fuse implant region is doped with P-type ions.

9. The anti-fuse structure of claim 6, wherein the doped region is a P-doped region, and the anti-fuse implant region is doped with N-type ions.

10. A semiconductor device, comprising:
a semiconductor substrate, comprising an active area and an isolation structure, the isolation structure defining the active area, the active area comprising a wide portion and a narrow portion connected to the wide portion;
a first anti-fuse material layer on the semiconductor substrate, the first anti-fuse material layer covering the narrow portion and extending from the narrow portion to cover a part of the isolation structure, the first anti-fuse material layer further extending to cover a first part of the wide portion at a side of the wide portion adjacent to the narrow portion, wherein the first part of the wide portion comprises two corners of the wide portion adjacent to the narrow portion and an edge of the wide portion connecting the narrow portion, wherein the first anti-fuse material layer has a smaller thickness at a first portion covering the corners and the edge of the wide portion than at a second portion covering the isolation structure;
a second anti-fuse material layer formed on the first anti-fuse material layer;
a first electrode, formed on and electrically connected to the second anti-fuse material layer; and
a second electrode formed on and electrically connected to a second part of the wide portion that is not covered by the first anti-fuse material layer.

11. The semiconductor device of claim 10, wherein one of the first anti-fuse material layer and the second anti-fuse material layer has an anti-fuse break down feature at a position covering the first part of the wide portion to provide an electrical connection path between the first electrode and the second electrode.

12. The semiconductor device of claim 10, wherein each of the narrow portion and the wide portion is of a rectangular shape, and the active area comprises a "T" shaped surface.

13. The semiconductor device of claim 10, wherein a line connecting centers of the narrow portion and the wide portion is parallel to a side of the wide portion.

14. The semiconductor device of claim 10, wherein the corners and the edge comprise an "L" shape.

15. The semiconductor device of claim 10, wherein the narrow portion has a width that is 1/5-1/20 of a width of the wide portion in a same direction.

16. The semiconductor device of claim 10, wherein the active area comprises an anti-fuse implant region and a doped region, the anti-fuse implant region formed at least in the narrow portion and in the first part of the wide portion covered by the first anti-fuse material layer, the doped region formed in the second part of the wide portion not covered by the first anti-fuse material layer, the doped region having a depth that is smaller than a depth of the anti-fuse implant region so that the doped region is located on the anti-fuse implant region in the second part of the wide portion, the anti-fuse implant region and the doped region doped with different dopants.

17. The semiconductor device of claim 16, wherein the anti-fuse implant region is doped at a concentration ranging from $1e^{14}/cm^2$ to $1e^{15}/cm^2$.

18. The semiconductor device of claim 16, wherein the doped region is an N-doped region, and the anti-fuse implant region is doped with P-type ions.

19. The semiconductor device of claim 16, wherein the doped region is a P-doped region, and the anti-fuse implant region is doped with N-type ions.

* * * * *